(12) United States Patent
Marchetti (10) Patent No.: US 9,683,794 B2
(45) Date of Patent: Jun. 20, 2017

(54) INDIRECT FREE COOLING MODULE

(71) Applicant: SCHNEIDER ELECTRIC IT CORPORATION, West Kingston, RI (US)

(72) Inventor: Daniele Marchetti, Chioggia (IT)

(73) Assignee: SCHNEIDER ELECTRIC IT CORPORATION, West Kingston, RI (US)

(*) Notice: Subject to any disclaimer, the term of this patent is extended or adjusted under 35 U.S.C. 154(b) by 186 days.

(21) Appl. No.: 14/484,595

(22) Filed: Sep. 12, 2014

(65) Prior Publication Data

US 2016/0076831 A1    Mar. 17, 2016

(51) Int. Cl.
*G05D 23/00* (2006.01)
*F28F 27/02* (2006.01)
*H05K 7/20* (2006.01)

(52) U.S. Cl.
CPC ......... *F28F 27/02* (2013.01); *H05K 7/20745* (2013.01); *H05K 7/20836* (2013.01)

(58) Field of Classification Search
CPC ...... F24F 11/001; F24F 11/006; F24F 11/008; F24F 13/30; H05K 7/20745; H05K 7/20836; H05K 7/20736; F28F 27/02
USPC .......................................... 165/300, 288, 47
See application file for complete search history.

(56) References Cited

U.S. PATENT DOCUMENTS

| 4,211,207 A * | 7/1980 | Molivadas ............... F24J 2/204 126/587 |
| 4,909,310 A * | 3/1990 | Umemura ............. F24F 1/0007 165/127 |
| 6,018,953 A | 2/2000 | Belding et al. |
| 8,516,839 B2 | 8/2013 | Hakbijl et al. |
| 8,584,739 B2 | 11/2013 | Kinkel |
| 2010/0252231 A1* | 10/2010 | Tozer .................... F24F 5/0035 165/47 |
| 2011/0100618 A1* | 5/2011 | Carlson ................ F24F 11/0001 165/287 |
| 2011/0127027 A1* | 6/2011 | Kashirajima ........... F24F 3/065 165/286 |
| 2012/0171943 A1* | 7/2012 | Dunnavant ........ H05K 7/20745 454/184 |
| 2012/0298334 A1 | 11/2012 | Madaffari et al. |

OTHER PUBLICATIONS

Extended European Search Report from corresponding European Application No. 15183658.2 dated Feb. 17, 2016.

* cited by examiner

*Primary Examiner* — Davis Hwu
(74) *Attorney, Agent, or Firm* — Lando & Anastasi, LLP (57) ABSTRACT

An indirect free cooling module and method for cooling air from a data center is provided. The module includes an adiabatic device in fluid communication with a source of external air, at least one heat exchanger in fluid communication with the adiabatic device and a flow of air from the data center, a damper system in fluid communication with the at least one heat exchanger, and a control system in communication with the damper system and configured to selectively direct the flow of air from the data center to the heat exchanger and to selectively direct a flow of air from the at least one heat exchanger through the damper system.

20 Claims, 6 Drawing Sheets

INDIRECT FREE COOLING MODULE

BACKGROUND

Technical Field

The technical field relates generally to the field of free cooling, and more particularly to an indirect free cooling module.

Background Discussion

Free cooling refers to cooling techniques in which low external air temperatures are used to assist in cooling operations. For example, rather than using electrically powered air condition systems exclusively, free cooling techniques make use of cool air sourced from an external environment. Free cooling methods may be either direct or indirect. Direct free cooling refers to a cooling technique where air sourced from an external environment, such as the outdoors, is mixed directly with hot air sourced from an internal environment, such as a room in a building. Direct free cooling has certain disadvantages. For example, pollutants that may be present in the air sourced from the external environment may be transferred to the internal environment that is being cooled. The pollutants may be damaging to living organisms, such as humans, plants, and animals that may be present in a room that is in contact with a direct free cooling device. The pollutants may also be damaging to equipment, such as electronic equipment that is located in a room serviced by the direct free cooling device. The pollutants can interfere with the proper working order of the equipment, which leads to increased maintenance costs a shorter useful life.

In contrast, indirect free cooling refers to a cooling technique where air sourced from an external environment is mixed indirectly with hot air sourced from an internal environment. This is accomplished through the use of one or more intermediate devices that function to transfer heat from the internal environment, such as a room containing computer equipment, to cool air delivered from an external environment through the use of an intermediate fluid.

SUMMARY

According to at least one embodiment, an indirect free cooling module for cooling air from a data center is provided. The indirect free cooling module includes an adiabatic device in fluid communication with a source of external air, at least one heat exchanger in fluid communication with the adiabatic device and a flow of air from the data center, a damper system in fluid communication with the at least one heat exchanger, and a control system in communication with the damper system and configured to selectively direct the flow of air from the data center to the heat exchanger and to selectively direct a flow of air from the at least one heat exchanger through the damper system.

The indirect free cooling module may further include at least one sensor in communication with the control system, the at least one sensor being configured to determine at least one of a temperature and a humidity value of one of the source of external air and the air from the data center, and the control system may be further configured to determine at least one operating condition based on at least one value determined by the at least one sensor. According to one embodiment, the at least one sensor includes a first sensor and a second sensor, the first sensor in fluid communication with the flow of air from the data center and configured to determine a temperature value of the air from the data center, and the second sensor in fluid communication with the source of external air and configured to determine a dry bulb temperature value and a wet bulb temperature value of the source of external air. According to another embodiment, the control system is further configured to receive a set point temperature value for the air from the data center, and the at least one operating condition includes at least one of: a difference between the value of the dry bulb temperature and the value of the wet bulb temperature is greater than a first threshold value, a difference between the value of the temperature of the air from the data center and the value of the dry bulb temperature is greater than a second threshold value, a difference between the value of the temperature of the air from the data center and the value of the wet bulb temperature is greater than the second threshold value, and the set point temperature has a greater value than either the value of the dry bulb temperature and the value of the wet bulb temperature. According to a further embodiment, the control system directs a flow of air from the data center to an inlet of the at least one heat exchanger and directs a flow of air from an outlet of the at least one heat exchanger to an inlet of the damper system when at least one operating condition is satisfied.

In the indirect free cooling module, the at least one heat exchanger may include a first heat exchanger in fluid communication with the air from the data center and a second heat exchanger in fluid communication with the adiabatic device. According to one embodiment, the first heat exchanger and the second heat exchanger are arranged in series and are each in fluid communication with cooled external air produced by the adiabatic device.

According to another embodiment, a cooling system for cooling air from a data center is provided. The cooling system includes a cooling device in fluid communication with a flow of air from the data center, an indirect free cooling module comprising: an adiabatic device in fluid communication with a source of external air, and at least one heat exchanger in fluid communication with the adiabatic device and the flow of air from the data center, a damper system in fluid communication with the flow of air from the data center, the cooling device, and the at least one heat exchanger of the indirect free cooling module, and a control system in communication with the damper system and configured to selectively direct the flow of air from the data center to at least one of an inlet of the at least one heat exchanger and to an inlet of the at least one cooling device.

The cooling system may further include at least one sensor in communication with the control system, the at least one sensor being configured to determine at least one of a temperature value and a humidity value of one of the source of external air and the air from the data center, and the control system may be further configured to determine at least one operating condition based on at least one value determined by the at least one sensor. According to one embodiment, the at least one sensor includes a first sensor and a second sensor, the first sensor in fluid communication with the flow of air from the data center and configured to determine a temperature value of the air from the data center, and the second sensor in fluid communication with the source of external air and configured to determine a dry bulb temperature value and a wet bulb temperature value of the source of external air.

According to another embodiment, the control system is further configured to receive a set point temperature value for the air from the data center, and the at least one operating condition includes at least one of: the set point temperature having a higher value than either the value of the dry bulb temperature and the value of the wet bulb temperature, a difference between the value of the dry bulb temperature and the value of the wet bulb temperature is greater than a first threshold value, a difference between the value of the temperature of the air from the data center and the value of the dry bulb temperature is greater than a second threshold value, a difference between the value of the temperature of the air from the data center and the value of the wet bulb temperature is greater than the second threshold value, and the set point temperature has a greater value than either the value of the dry bulb temperature and the value of the wet bulb temperature. According to a further embodiment, the control system directs a flow of air from the data center to the inlet of the at least one heat exchanger and directs a flow of air from the at least one heat exchanger through the damper system when at least one operating condition is satisfied. According to a further embodiment, the flow of air from the at least one heat exchanger and through the damper system is in fluid communication with the inlet of the cooling device. According to another embodiment, the control system directs a flow of air from the data center through the damper system to the cooling device when at least one operating condition is not satisfied. According to yet another embodiment, the control system directs a flow of air from the data center to the heat exchanger and to the inlet of the at least one cooling device when at least one operating condition is satisfied and when at least one operating condition is not satisfied.

According to at least one embodiment, the indirect free cooling module is configured to be retrofitted with the cooling device and the damper system.

According to at least one embodiment, a method of cooling air from a data center using a cooling system is provided. The cooling system includes a cooling device, an indirect free cooling module that includes an adiabatic device and at least one heat exchanger, a first sensor configured to determine a temperature value of a flow of air from the data center, and a second sensor configured to determine a dry bulb temperature value and a wet bulb temperature value of a source of external air. The method includes acts of receiving a set point temperature value for the flow of air from the data center, determining a temperature value of the flow of air from the data center using the first sensor, determining a dry bulb temperature value and a wet bulb temperature value of the source of external air using the second sensor, calculating a difference between the value of the dry bulb temperature and the value of the wet bulb temperature to determine a first calculated value, calculating a difference between the value of the temperature of the air from the data center and the value of the dry bulb temperature to determine a second calculated value, calculating a difference between the value of the temperature of the air from the data center and the value of the wet bulb temperature to determine a third calculated value, calculating a difference between the value of the set point temperature and the value of the wet bulb temperature to determine a fourth calculated value, and selectively directing the flow of air from the data center to at least one of an inlet of the at least one heat exchanger and to an inlet of the cooling device based on at least one of the first calculated value, the second calculating value, the third calculated value, and the fourth calculated value.

According to one embodiment, the method further includes directing the flow of air from the data center to the inlet of the cooling device when the first calculated value is lower than a first threshold value and the second calculated value is lower than a second threshold value. According to another embodiment the method further includes directing the flow of air from the data center to the inlet of the at least one heat exchanger when the first calculated value is greater than a first threshold value, the third calculated value is greater than a second threshold value, and the fourth calculated value is greater than a third threshold value. According to yet another embodiment, the method further includes directing the flow of air from the data center to the inlet of the at least one heat exchanger and to the inlet of the cooling device when the first calculated value is greater than a first threshold value, the third calculated value is greater than a second threshold value, and the fourth calculated value is lower than a third threshold value.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

By way of introduction, the present disclosure is directed to an indirect free cooling module. According to some embodiments, the indirect free cooling module may be used for cooling air from a data center. As used herein, the term "cooling" is to be construed broadly and generally relates to a process that conditions air to meet one or more desired characteristics, such as lowering the air's temperature, or adjusting the humidity upward or downward. According to at least one embodiment, the indirect free cooling module may include an adiabatic device that is used in combination with one or more heat exchangers. In certain instances, the adiabatic device may utilize one or more forms of evaporative cooling. The indirect free cooling module may be used in combination with a cooling device to cool an environment such as a room within a data center.

The aspects disclosed herein in accordance with the present disclosure, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present disclosure.

Figure 1:
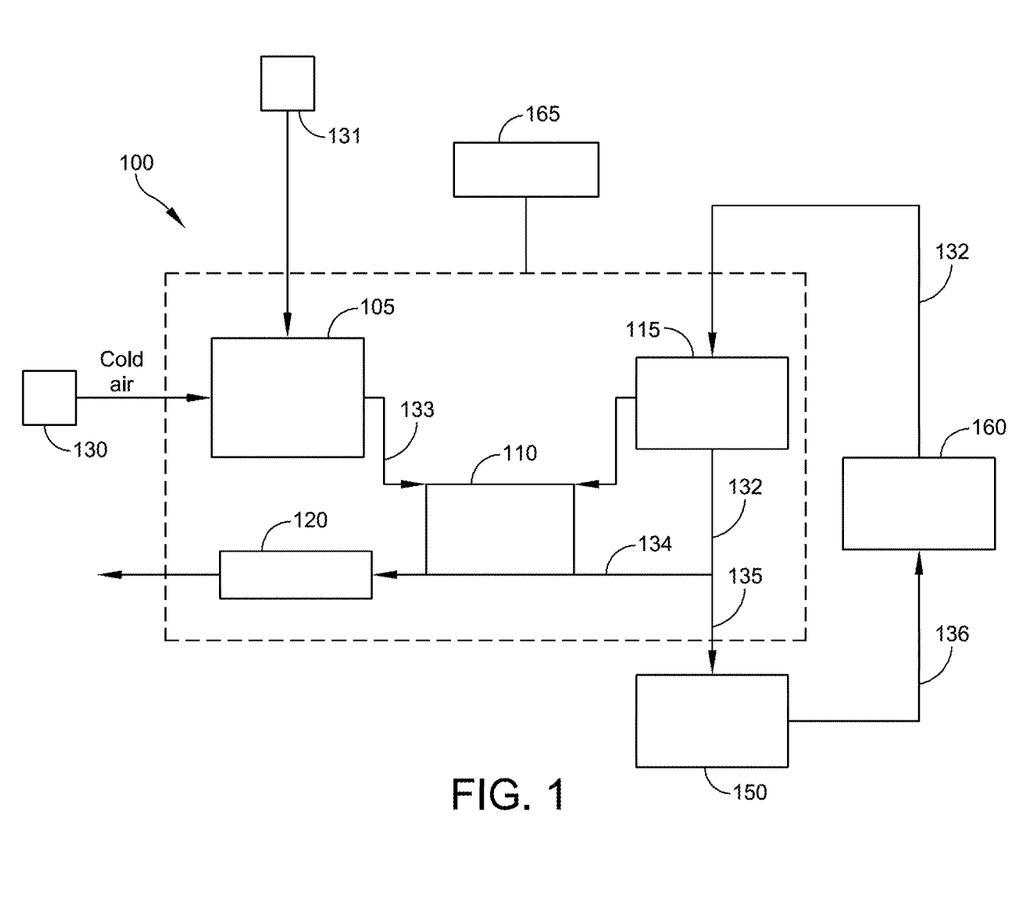
FIG. 1 is a block diagram of an internal environment and a cooling device that incorporates the use of an indirect free cooling module according to an embodiment of the disclosure.

Referring now to the drawings, and in particular to FIG. 1, one embodiment is shown of an indirect free cooling module, generally indicated at 100, as used in combination with a cooling device 150 and an internal environment 160. According to some embodiments, the free cooling module 100 is positioned upstream from the cooling device 150. In certain embodiments, the free cooling module 100 is configured to be retro-fitted into an existing heating and cooling system. For example, an indirect free cooling module 100 may be positioned within an existing system that includes an internal environment 160 and a cooling device 150 such that the cooling module 100 assists the cooling device 150 in cooling the internal environment 160. In other embodiments, the free cooling module 100 may be configured to be a stand-alone unit or system.

The internal environment 160 may be a confined space, such as a room, inside a building or other structure. For example, the internal environment 160 may be one or more rooms in a public or private building, such as a private residence, office space, or other commercial or municipal space, or may include spaces within an industrial or manufacturing complex. Other examples may include temporary structures, such as tents, or vehicles, including cars and trucks, or recreational vehicles (RVs), or boats. The internal environment 160 may be any space capable of containing air that may be conditioned by one or more cooling devices 150 and/or one or more indirect free cooling modules 100.

According to at least one embodiment, the internal environment 160 may be a data center. A data center may include one or more rooms or spaces that contain rows of equipment racks designed to house electronic equipment, such as data processing, networking, and telecommunications equipment. During operation the electronic equipment generates heat that needs to be treated to ensure the continued performance, reliability, and useful life of the equipment components housed by the equipment racks. One or more embodiments of the systems disclosed herein are designed to treat the heat produced by the electronic equipment within the data center and return cool air back to the data center.

The internal environment 160 may be cooled by one or more cooling devices 150. According to one or more aspects, the cooling device 150 may be based on a vapor compression cycle. The vapor compression cycle involves compression and expansion of a gas such as chlorinated fluorocarbon or halogenated chlorofluorocarbon or ammonia. The gas is compressed to a liquid state and then allowed to expand back to a vapor state. In the expansion stage of the process, heat is required to change the liquid back to a gas. In other embodiments, the cooling device 150 uses a cooling medium, such as chilled water for purposes of cooling. For example, a condensing unit within the cooling device 150 may be in fluid communication with a chilling unit, which is adapted to provide chilled water to the condensing unit. In certain instances the chilling unit is positioned at a location external to the module 100. Although this particular example uses chilled water as the cooling medium for purposes of cooling, other cooling mediums are within the scope of this disclosure, including other liquid mediums besides chilled water.

According to at least one embodiment, the cooling device 150 may be a computer room air conditioner (CRAC) that functions to cool a data center. The CRAC unit may be positioned in any one of a number of locations in or around the data center. For example, CRAC units may be positioned around the periphery of a room within the data center. In some instances, the CRAC units may intake air from the fronts of the units and output cooler air upwardly toward the ceiling of the data center room. In other instances, the CRAC units intake air from near the ceiling of the data center room and discharge cooler air under a raised floor for delivery to the fronts of the equipment racks.

Indirect Free Cooling Module

In accordance with one or more embodiments, the indirect free cooling module 100 includes an adiabatic device 105. As used herein, the term "adiabatic" refers to a change of state without any substantial loss or gain of heat energy. Thus, an adiabatic device does not exchange heat with its surroundings.

According to some embodiments, the adiabatic device 105 may be based on the principle of evaporative cooling. Unsaturated air having a relative humidity below 100% has a propensity to adsorb further water by evaporation. The latent heat required to evaporate the water causes cooling of the air, as its enthalpy remains substantially constant. An adiabatic saturation process may be described as a process in which a steady stream of unsaturated air of unknown specific humidity is passed through a long insulated channel that contains a pool of water. As the air flows over the water, some water will evaporate and mix with the airstream. The moisture content of air will increase during the process, and its temperature will decrease, since part of the latent heat of vaporization of the water that evaporates will come from the air. If the channel is long enough, the airstream will exit as saturated air (100% relative humidity) at the exit temperature.

In one embodiment, the adiabatic device 105 is coupled or otherwise connected to a source of water 131 and a source of external air 130. The adiabatic device 105 is configured to have heat transfer from the source of external air 130 to the source of water 131. The adiabatic device 105 thus functions to cool the source of external air 130. This cooled external air may exit the adiabatic device 105 as stream 133. According to some embodiments, the external air 130 is sourced from the outdoors. In other embodiments, the external air 130 may come from another building or structure or process.

In some embodiments, the adiabatic device 105 is configured to be fed by pressurized water. For example, the source of water 131 delivered to the adiabatic device 105 may be pressurized using one or more nozzles. The nozzles may be pressurized using one or more pumps. The pressurized water dispersed through the nozzle creates small water droplets having a diameter in a range of from about 20 microns to about 50 microns. The fine droplets created by the pressurized water increase the surface area available for evaporation when emitted into air.

In certain embodiments, the adiabatic device 105 contains media that may be fed by water. For example, one or more types of media, such as a porous material, may be continuously wetted by the source of water 131. In certain instances, this may be accomplished through the use of one or more pumps. The porous media has a large surface area for promoting heat transfer. According to some examples, the porous media may comprise individual pellets of one or more sizes. For example, the pellets may range from nanometers to millimeters in size and may be any shape, such as spheres or cylinders that are suitable for performing heat exchange. According to other embodiments, the porous media may be constructed to form an interconnected surface possessing a permeability and porosity amenable to transferring heat.

The indirect free cooling module 100 may further include one or more heat exchangers 110. In some embodiments, the heat exchanger 110 is positioned downstream from the adiabatic device 105. According to at least one embodiment, the heat exchanger 110 functions to cool hot air delivered from the internal environment using the cooled external air from stream 133 that is produced by the adiabatic device 105. In general, a heat exchanger is a device that passively transfers heat from one material to another. The materials are typically fluids, either liquids or gases. The work done by heat exchangers is based on the laws of thermodynamics in that when an object is heated, the heat energy contained within that object will diffuse outward to the surrounding environment until equilibrium has been reached between the object and the environment.

The basic heat exchanger design generally involves two chambers or passageways separated by a barrier. A feed stream with thermal energy to be transferred is passed through one passageway, and a stream that may receive thermal energy is passed through the other passageway. The streams may be in either co- or counter-current flow. Heat diffuses between the two streams by passing through the barrier until the rate of heat transfer is matched by the resistance to such transfer. The type and size of heat exchanger used depends on the type of material used as the barrier and various properties of the material streams introduced including their phase, temperature, density, viscosity, pressures, chemical compositions, and various other characteristics.

The two most common types of heat exchangers are shell and tube heat exchangers, and plate and frame heat exchangers. Other types of heat exchangers include, but are not limited to, adiabatic wheel heat exchangers, plate fin heat exchangers, fluid heat exchangers, waste heat recovery units, dynamic scraped surface heat exchangers, phase-change heat exchangers, direct contact heat exchangers, air coils, and spiral heat exchangers. An additional type of heat exchanger may include a heat pipe type of heat exchanger.

According to one embodiment, the heat exchanger 110 may be a shell and tube heat exchanger. Shell and tube heat exchangers consist of a series of tubes arranged in bundles and suspended within shells by insertion into spacer plates. Shell and tube heat exchangers are considered robust because of the strength of their materials, and effective because of their high heat coefficients and the fluid mixing profiles caused by their design. The materials are typically suited for higher-pressure and higher temperature applications. Tubes must be made of a strong, thermally conductive, corrosion-resistant material. A high quality tube material is typically a metal, including, but not limited to, copper alloy, stainless steel, carbon steel, non-ferrous copper alloy, Inconel, nickel, Hastelloy, titanium, or any combination thereof.

According to another embodiment, the heat exchanger 110 may be a plate heat exchanger. A plate heat exchanger is composed of multiple, thin, slightly separated plates that have large surface areas and fluid flow passages for heat transfer. The plates are usually made of metal. Plate heat exchangers are generally compact and associated with a high overall heat transfer coefficient. Fluids spread out over the plates and thus facilitate the transfer of heat and greatly increase the speed of temperature changes. These types of heat exchangers are well suited to transfer heat between medium- and low-pressure materials.

According to some embodiments, the heat exchanger 110 may be a spiral heat exchanger. A spiral heat exchanger may refer to a helical tube configuration, but more often is a pair of flat surfaces that are coiled to form two channels in a counter-flow arrangement. Spiral heat exchangers are generally associated with efficient use of space and low energy costs.

The indirect free cooling module 100 may further include a damper system 115. The damper system 115 may include one or more dampers or baffles that function to control the speed and direction of air through one or more components of the indirect free cooling module 100 and/or components associated with the indirect free cooling module, such as the cooling device 150 and the internal environment 160. For example, the dampers may function to route hot air 132 delivered from the internal environment 160 through the heat exchanger 110. The damper system 115 may also include ducts and motors or other structures and devices to assist in moving and directing the air. As discussed further below, one or more dampers may be positioned throughout the system. In some instances, dampers may function to allow the hot air 132 to bypass the indirect free cooling module 100. In other instances, dampers may function to allow a portion of the hot air 132 to bypass the indirect free cooling module 100. In other words, some of the hot air 132 is treated by the indirect free cooling module 100 and some of the hot air 132 is fed directly into the cooling device 150. In still other instances, dampers function to direct all of the hot air 132 delivered from the internal environment 160 to the indirect free cooling module 100.

According to at least one embodiment, the indirect free cooling module 100 may further include one or more fans 120. The fans 120 may be positioned at one or more locations throughout the indirect free cooling module 100. For example, a fan 120 may be positioned within the indirect free cooling module 100 so as to route the external air 130 through the heat exchanger 110. In certain instances, the fan 120 may work in conjunction with one or more dampers of the damper system 115.

In one embodiment, cooled external air 133 produced by the adiabatic device 105 is introduced into heat exchanger 110. Hot air 132 delivered from the internal environment 160 is also introduced into heat exchanger 110. Heat from the hot air 132 is transferred to the cooled external air 133, producing treated air 134. Treated air 134 may make up all, part, or none of the feed air stream 135 to the cooling device 150. For example, all of the hot air 132 from the internal environment 160 may flow through the damper system 115 and then proceed through the heat exchanger 110 to transfer heat to the cooled external air 133 from the adiabatic device 105. In another example, hot air 132 may flow through the damper system 115 and flow directly into the cooling device 150 as feed air stream 135, and thereby completely bypass the indirect free cooling system 100. In yet another example, a portion of the feed air stream 135 comes from treated air 134 produced by the indirect free cooling module 100 and another portion comes as hot air 132 delivered directly from the internal environment 160. The cooling device 150 cools the feed air stream 135 to further produce cooled air 136, which is further directed to the internal environment 160.

The indirect free cooling module 100 may further include a control system 165 to control the operation of the indirect free cooling module 100. The control system 165 may be configured to control one or more components of the indirect free cooling module 100, such as the adiabatic device 105, damper system 115, and/or heat exchanger 110. For example, the control system 165 may control a portion of the hot air 132 directed to the indirect free cooling module 100.

Figure 2:
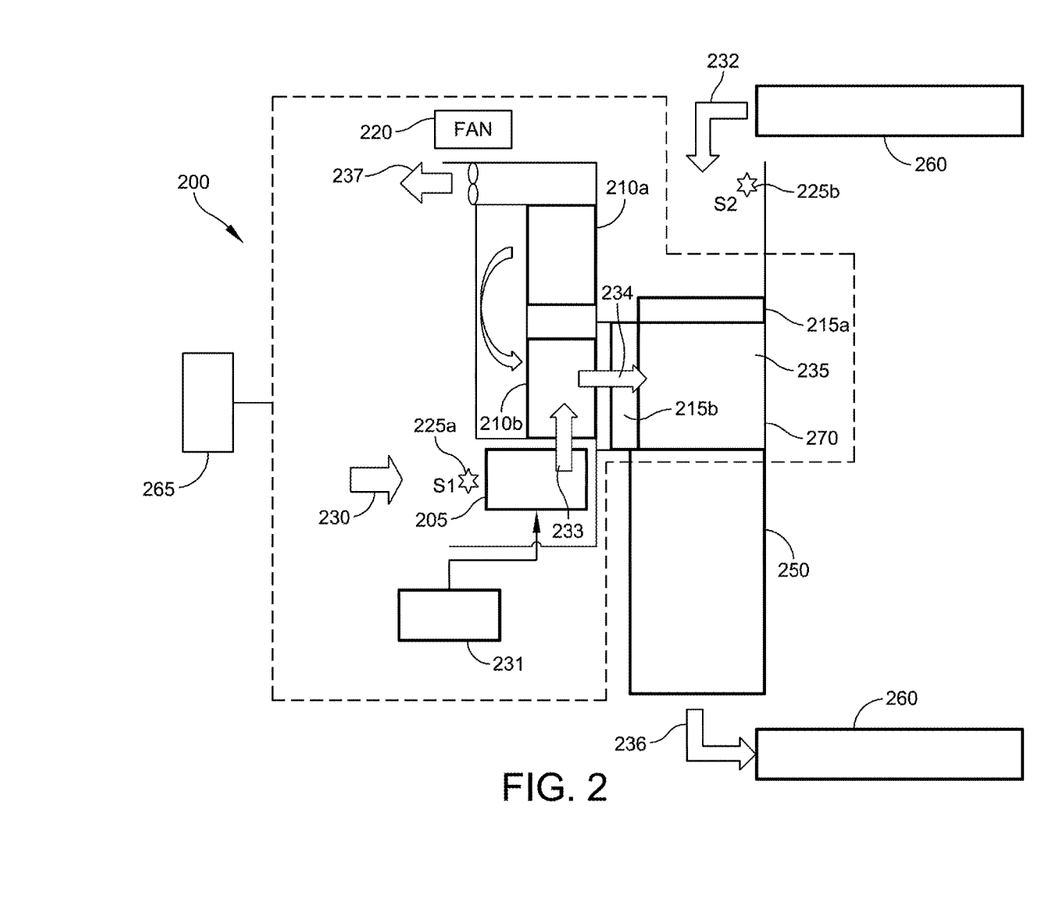
FIG. 2 is a block diagram of an indirect free cooling module according to another embodiment of the disclosure.

Referring to FIG. 2, an example of the main components of an indirect free cooling module, generally referred to at 200, are shown in combination with a cooling device 250 and an internal environment 260, such as a data center. The cooling device 250 and internal environment 260 may be provided as discussed and described above with reference to cooling device 150 and internal environment 160. Likewise, the indirect free cooling module 200 includes heat exchangers 210a and 210b, which may be provided as discussed above with reference to heat exchanger 110. Also, the indirect free cooling module 200 includes an adiabatic device 205 that is also provided and characterized as previously discussed with adiabatic device 105. One or more sources of water 231 may also be in communication with the adiabatic device 205.

The indirect free cooling module 200 includes one or more sensors 225a and 225b that are positioned in one or more locations throughout the system. The sensors 225a and 225b may include any suitable type of sensor that emits or receives a signal. In some embodiments, the sensors 225a and 225b may be configured to detect or otherwise collect information related to temperature or humidity. For example, the adiabatic device 205 is coupled or otherwise in communication with sensor 225a, which is configured to collect the dry bulb and wet bulb temperature of the source of external air 230, as discussed above with reference to external air 130. Further, sensor 225b is configured to collect the dry bulb temperature of the hot air 232 delivered from the internal environment 260. One or more other sensors may be placed throughout the system as desired, for example, to obtain information regarding water 231 feeding into the adiabatic device 205 or to determine the rate of airflow through one or more components of the damper system 215, which includes dampers 215a and 215b.

The sensors 225a and 225b may also be in communication with a control system 265, as discussed previously with reference to control system 165. The control system 265 may be configured to control one or more components of the system, including the indirect free cooling module 200 and the cooling device 250, through the use of sensors 225a and 225b. For example, sensors 225a and 225b may be configured to be responsive to one or more air conditions and to provide an input signal to the control system 265. In another example, the positioning of one or more elements of the damper system, such as dampers 215a and 215b, may be established and thereby controlled by using the sensors 225a and 225b to control the flow rate of air through the system.

The indirect free cooling module 200 includes a first heat exchanger 210a and a second heat exchanger 210b. According to one embodiment, the first and second heat exchangers 210a and 210b are air-to-air plate heat exchangers configured in series to promote a cross flow between hot air 232 from the internal environment 260 and the cooled external air 233 from the adiabatic device 205. The hot air 232 first enters first heat exchanger 210a, where it exchanges heat with the cooled external air 233, and then enters the second heat exchanger 210b, where it cools even further by exchanging heat with the cooled external air 233. According to this embodiments, cooled external air 233 produced by adiabatic device 105 may be directed to both first and second heat exchangers 210a and 210b as a source of intermediary cooling fluid. According to certain aspects, the use of two heat exchangers may accommodate certain layouts. For example, the arrangement shown in FIG. 2 allows for the hot air 232 to be directed in a direction 180 degrees from its point of entry into the first heat exchanger 210a to its point of exit from the second heat exchanger 210b. Exhaust air 237 exits one or more of the heat exchangers 210a and 210b to be expelled to an external location. According to other embodiments, a single heat exchanger may be used. A single heat exchanger may be suitable for layouts where the directional flow of air does not require a staged or step-wise approach.

According to other embodiments, the heat exchangers 210a and 210b may be arranged into a parallel configuration. For instance, a first portion of the heating load delivered from the internal environment 260 may be directed to one heat exchanger 210a and a second portion of the heating load may be directed to the other heat exchanger 210b. In a similar manner, a first portion of the cooled external air 233 produced by the adiabatic device 205 may be directed to one heat exchanger 210a and a second portion may be directed to the other heat exchanger 210b.

The damper system includes a first damper 215a and a second damper 215b. The first damper 215a is used to control the flow of hot air 232 delivered from the internal environment 260. The second damper 215b is used to control the flow of treated air 234 delivered from the indirect free cooling module 200. One or both of the airflows 232 and 234 may make up the feed stream 235 to the cooling device 250. For example, the first damper 215a may opened or otherwise be configured to route hot air 232 delivered from the internal environment 260 to the cooling device 250 to produce cooled air 236 that is then directed back to the internal environment 260. At the same time, the second damper 215b may be configured closed or otherwise configured to block treated air 234 delivered from the indirect free cooling module from entering the cooling device 250. The dampers 215a and 215b therefore may define a bypass for the hot air 232 so in instances where indirect free cooling is not necessary or is not available. According to some embodiments, the feed stream 235 may be surrounded or otherwise collected within a plenum 270 before it is directed into the cooling device 250. The plenum 270 may be constructed from materials used in heating and cooling applications, such as sheet metal, and in certain instances may be thermally insulated either externally or internally.

One or more fans 220 may also be used to assist in moving air through or to one or more components of the system. For example, a fan 220 may be positioned within the indirect free cooling module 200 to move the source of external air through one or more of the heat exchangers 210a and 210b.

When the indirect free cooling module is placed in combination with a source of air to be cooled, such as air delivered from a data center, and a cooling device, the module is capable of performing in three separate modes of operation. These three operating modes are discussed in turn below.

Mechanical Mode

Figure 3:
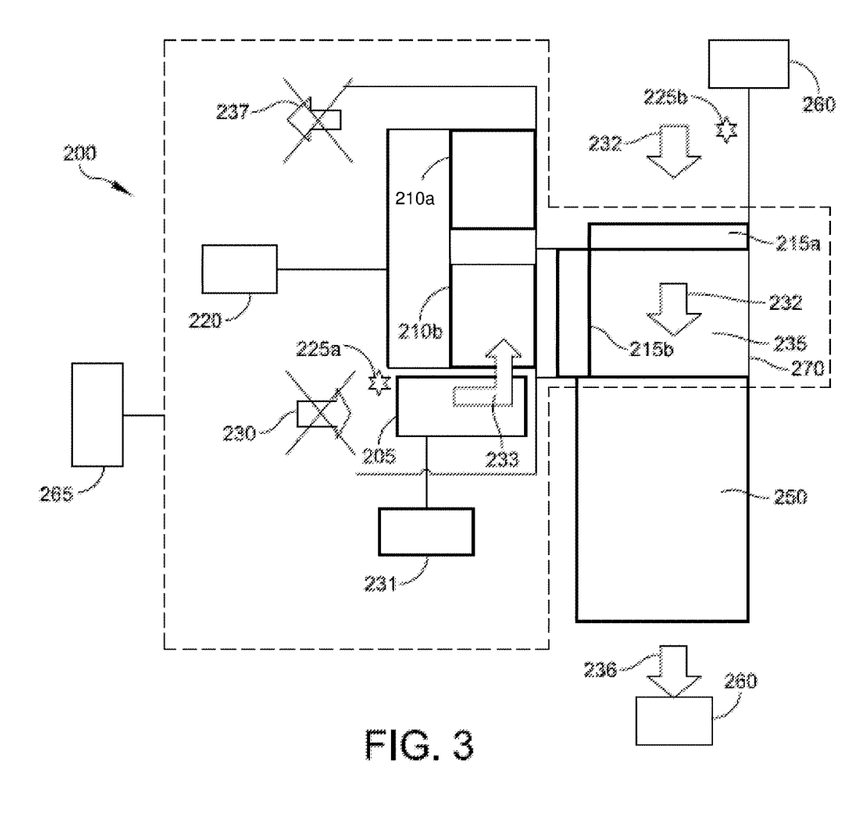
FIG. 3 is a block diagram of an indirect free cooling module in combination with a cooling device that incorporates a first mode of use according to another embodiment of the disclosure.

Referring to FIG. 3, the system presented in FIG. 2 is shown, with the components configured as discussed and characterized above. Specifically, FIG. 3 illustrates a first operating mode of the indirect free cooling module, generally indicated at 200. During the first operating mode, which may be referred to as a mechanical mode, the indirect free cooling module 200 is completely bypassed by opening the first damper 215a and closing or otherwise disabling the second damper 215b. Hot air 232 delivered from the internal environment 260 flows directly into the cooling device 250 and exits as treated air 236 that may be introduced back into the internal environment 260. The feed air 235 to the cooling device 250 is therefore comprised entirely of the hot air 232 delivered from the internal environment. During this operating mode, one or more of the components of the indirect free cooling module, such as the heat exchangers 210a and 210b, one or more fans 220 associated with the indirect free cooling module 200, and adiabatic device 205, may be powered down.

As discussed further below, the indirect free cooling module 300 may be controlled by a control system 265 to operate in the mechanical mode under certain conditions. According to some embodiments, these operating conditions may relate to the set point temperature for air within the internal environment 260, the temperature and/or humidity of the source of external air 230, and the temperature and/or humidity of the hot air 232 exiting the internal environment 260. One or more of these conditions may be detected or otherwise established through the use of one or more sensors, such as sensors 225a and 225b. For example, the mechanical mode of cooling may be triggered when all three of the conditions discussed below fail. In another example, the mechanical mode may be triggered by a user, who may wish to bypass the indirect free cooling module 200.

Free Cooling Mode

Figure 4:
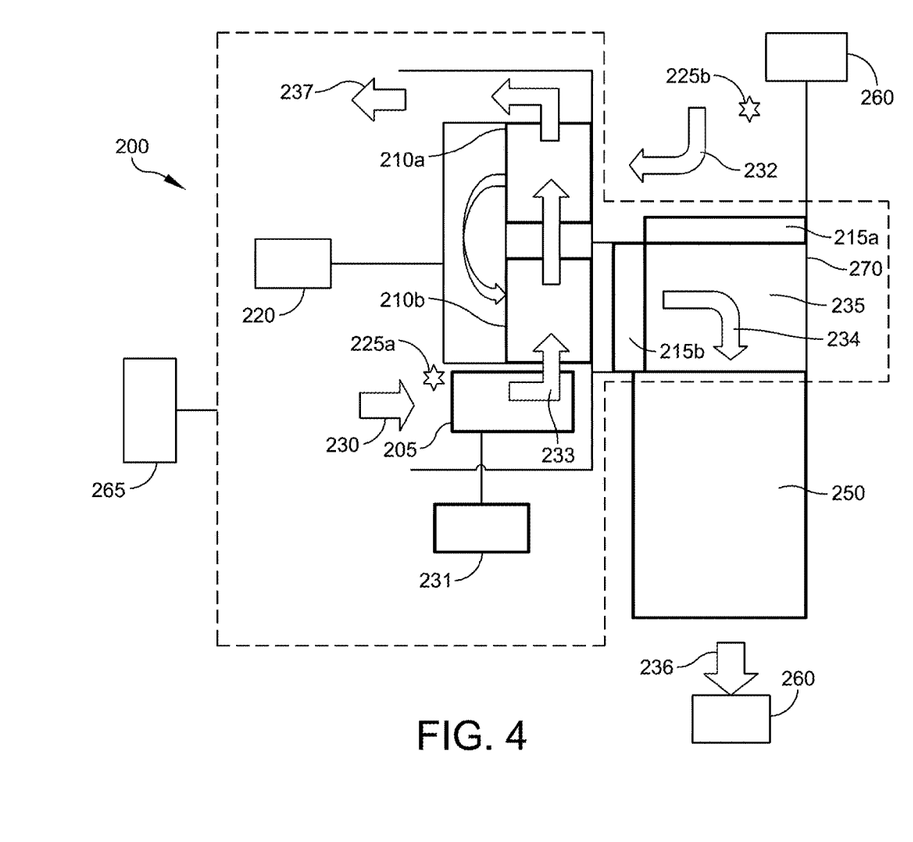
FIG. 4 is a block diagram of an indirect free cooling module in combination with a cooling device that incorporates a second mode of use according to another embodiment of the disclosure.

Referring to FIG. 4, a second operating mode using the system shown in FIG. 2 is illustrated. During the second operating mode, also referred to as the free cooling mode, all of the hot air 232 from the internal environment 260 is directed to the indirect free cooling module 200. Therefore, the feed air 235 directed into the cooling device 250 is comprised entirely of treated air 234 from the indirect free cooling module 200. During this mode of operation, the first damper 215a is closed and the second damper 215b is opened. Hot air 232 from the internal environment 260 is first directed through the first heat exchanger 210a, where it flows counter to a source of cooling fluid, such as cooled external air 233 exiting from the adiabatic device 205. This cools the hot air 232 to a first temperature. The first temperature may be a predetermined or threshold temperature or range of temperatures set by a user and/or control system. Air exiting the first heat exchanger 210a is then directed through the second heat exchanger 210b, where it is cooled even further through heat exchange in a counter-flowing cooling fluid, such as the cooled external air 233 provided by the adiabatic device 205. Again, air exiting the second heat exchanger as treated stream 234 may be cooled to a predetermined temperature or range of temperatures that is set by a user and/or control system. One or more fans 220 may also be used to move air through the indirect free cooling module 200. One or more sources of water 231 may also be in communication with the adiabatic device 205.

The free cooling mode of operation may be triggered or otherwise activated under one or more conditions. For example, the control system 265 may use one or more sensors, such as sensors 225a and 225b, positioned throughout the system to determine whether certain conditions are satisfied, such as whether one or more airflows associated with the system have certain temperature or humidity values. Listed below are three different non-limiting examples of conditions where the free cooling mode of operation may be activated. In practice, one or more of these conditions must be satisfied in order for the free cooling mode of operation to be activated. According to one embodiment, Conditions 1 and 2 must be satisfied. In another embodiment, Conditions 1 and 3 must be satisfied. In still other embodiments, all three of the conditions must be met.

Condition 1: $T_{air} > T_{set}$, where $T_{air}$ is the temperature of air within the internal environment 260 and $T_{set}$ is the set-point or desired temperature of the air within the internal environment 260. In other words, the temperature of the air in the internal environment 260 must be warmer than desired by the user.

Condition 2: $T_{ext.dry} < T_{air}$ by at least 4° C., where $T_{ext.dry}$ is the dry bulb temperature of the source of external air 230. In other words, the temperature of the source of external air 230 is lower than the temperature of the air within the internal environment 260.

Condition 3: $T_{ext.dry} - T_{ext.wet}$ is greater than 3° C., where $T_{ext.wet}$ is the wet bulb temperature of the source of external air 230. These temperature readings establish the state, including the content of water vapor and the sensible and latent energy (enthalpy) of the source of external air 230. According to some embodiments, these readings may be used in combination with an enthalpy/humidity diagram to define further operating conditions of the indirect free cooling module 200.

Mixed Cooling Mode

Figure 5:
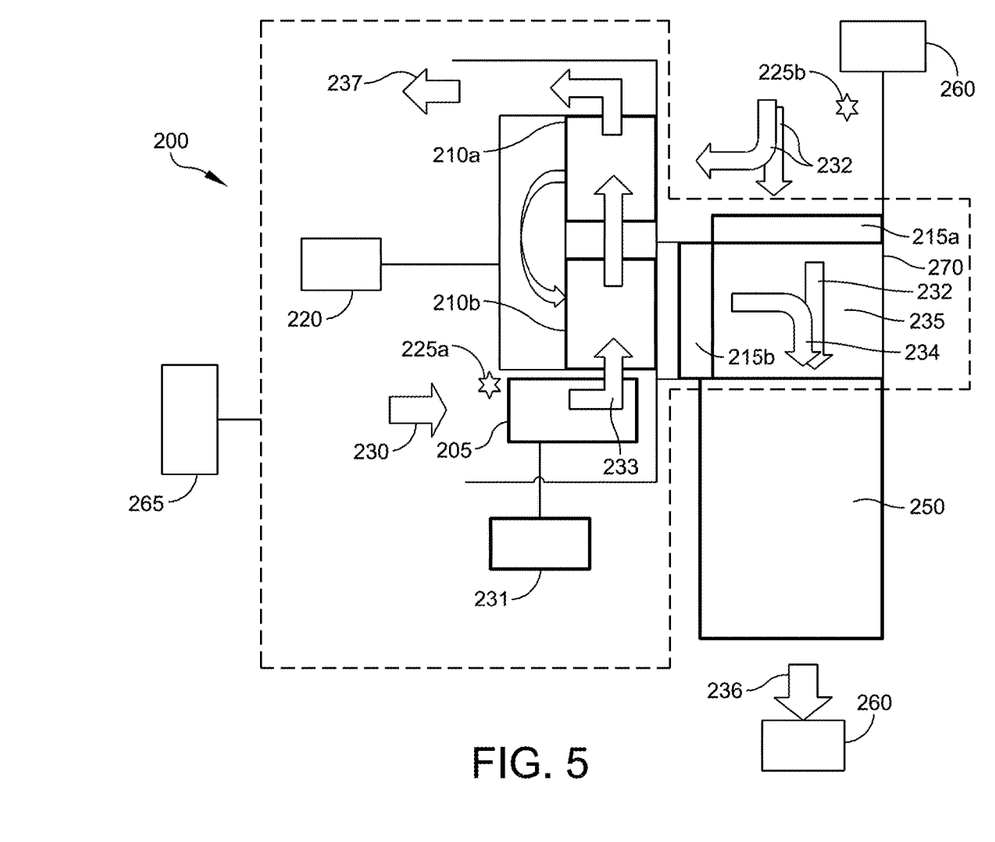
FIG. 5 is a block diagram of an indirect free cooling module in combination with a cooling device that incorporates a third mode of use according to another embodiment of the disclosure.

Referring to FIG. 5, a third operating mode using the system shown in FIG. 2 is illustrated. During the third mode of operation, also referred to as the mixed cooling mode, hot air 232 delivered from the internal environment 260 is directed through both the first damper 215a and the indirect free cooling module 200. Therefore, both the first damper 215a and the second damper 215b are open to a certain degree and the feed air 235 to the cooling device 250 is therefore comprised of a mixture of hot air 232 delivered directly from the internal environment and treated air 234 delivered from the indirect free cooling module 200. The proportion of hot air 232 directed to the indirect free cooling module 500 may vary, depending on the operating conditions of the system. In one embodiment, approximately 50% of the hot air 232 may be directed through the indirect free cooling module 200. As will be readily recognized by one of skill in the pertinent art, other portions are within the scope of this disclosure.

According to some embodiments, the mixed cooling mode of operation may be activated when one or more of the conditions outlined above are not met. For example, Condition 1 may not be met. An example of a control scheme for activating the mixed cooling mode is discussed further below.

Example Control Scheme

Figure 6:
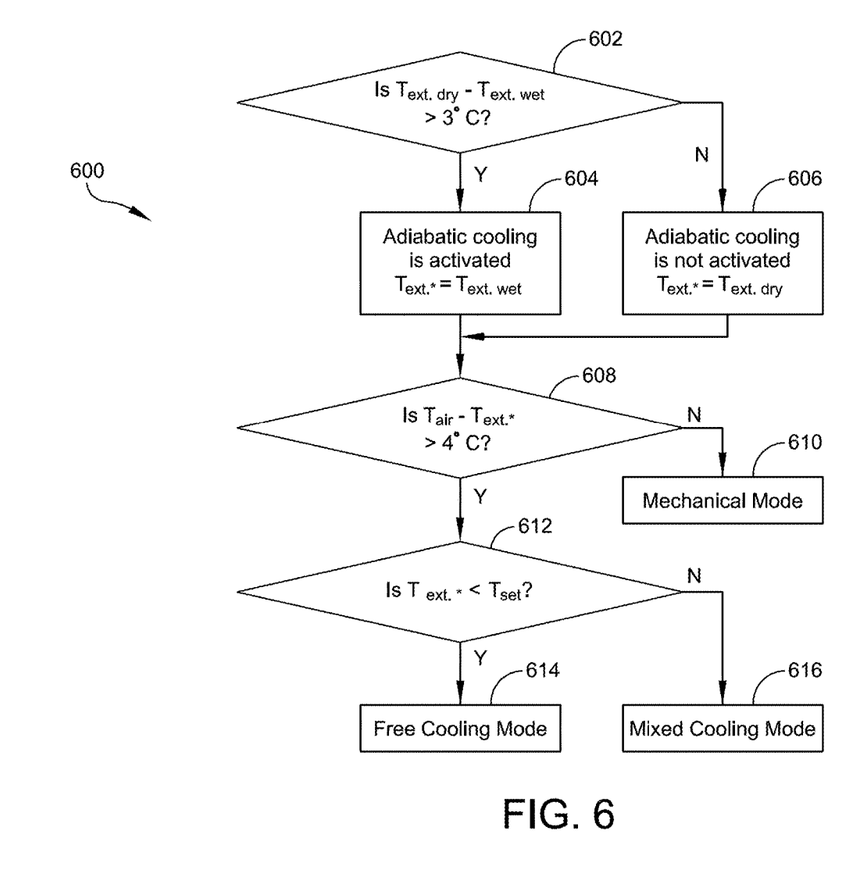
FIG. 6 is a flow diagram illustrating a process for controlling an indirect free cooling module in combination with a cooling device.

According to one embodiment, the operating modes associated with the mechanical mode, free cooling mode, and the mixed cooling mode may be activated according to the control scheme or process, generally indicated at 600, and illustrated by the flow chart in FIG. 6. This control scheme may be used by the controller 265 discussed above. In the flow chart, $T_{ext.dry}$ is the dry bulb temperature of the source of external air, $T_{ext.wet}$ is the wet bulb temperature of the source of external air, $T_{set}$ is the set-point or desired temperature of the air within the internal environment, $T_{air}$ is the temperature of air within the internal environment, and $T_{ext.}*$ is a virtual, or reference temperature used by the controller to determine which operating mode to activate.

The process starts at step 602, where a determination is made as to whether the adiabatic cooler included in the indirect free cooling module may be used. In this step, the system determines whether $T_{ext.dry}-T_{ext.wet}$ is greater than 3° C. If the answer is yes, then one or more mechanical systems associated with the adiabatic cooler are activated at step 604. For example, power may be supplied to a pump that is configured to create water droplets for the adiabatic cooler. Further, at step 604, the reference temperature $T_{ext.wet}*$ is set to equal the wet bulb temperature of the source of external air ($T_{ext.wet}$). If the answer to step 602 is no, then the process proceeds to step 606, where no mechanical systems associated with the adiabatic cooler are activated and the reference temperature $T_{ext.}*$ is set to equal the dry bulb temperature of the source of external air ($T_{ext.dry}$).

At step 608, a determination is made as to whether the free cooling module can be used. This is accomplished by determining if the difference between the temperature of the air within the internal environment and the reference temperature ($T_{air}-T_{ext.}*$) is greater than 4° C. In other words, the temperature of the external air needs to be lower than the temperature of the internal environment by a certain amount, which in this case, is 4° C. If the answer is no, then according to some embodiments, the mechanical mode of operation is activated at step 610, and air from the internal environment is directed only to the cooling device and therefore bypasses the indirect free cooling module, as discussed above. According to other embodiments, if the answer to step 608 is no, an additional calculation is performed using hysteresis compensation. As recognized by one of skill in the art, thermostats and control systems often use hysteresis to avoid rapidly switching on and off, since these systems take time to respond and will wear out faster if they are constantly turned on and off. With hysteresis, the cooler will turn on at temperature control point, but then not turn off until the temperature has decreased by a certain amount, or threshold value, that is set by a user or a control system. Similarly, the cooler will not turn back on until the temperature increases by the threshold value. For example, in reference to FIG. 6, if the threshold value is set at 1, then the mechanical mode may be activated if $T_{air}-T_{ext.}*<3°$ C.

Returning to FIG. 6, if the answer to step 608 is yes, then the process proceeds to step 612 where a determination is made as to whether the reference temperature is low enough to cool the air from the internal environment without the assistance of the cooing device. In this example, this is accomplished by determining whether the reference temperature is lower than the set point temperature ($T_{ext}<T_{set.}*$). If the answer to step 612 is yes, then the free cooling mode of operation is activated at step 614, as discussed above. For example, all of the air from the internal environment is directed to the indirect free cooling module. If the answer to step 612 is no, then the mixed cooling mode of operation is activated at step 616, as discussed above. In this instance, a portion of the air from the internal environment is directed to the indirect free cooling module and the remaining portion of the air is directed to the cooling device. In other words, a portion of the incoming air coming from the internal environment is directly delivered to both the indirect free cooling module and the cooling device.

The systems and methods disclosed herein possess a number of advantages. For example, the indirect free cooling module may be assembled or presented as a kit that is configured to retrofit an existing cooling system, such as cooling systems that utilize cooling devices based off vapor compression types of technology. Further, since there is no direct mixing between the source of external air and the source of hot air to be cooled, pollutants that may be present in the external air are not transferred to the environment being cooled.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. An indirect free cooling module for cooling air from a data center, comprising:
   an adiabatic device in fluid communication with a source of external air and configured to cool the source of external air to produce cooled external air;
   at least one heat exchanger configured to be in fluid communication with the adiabatic device and a flow of air from the data center and to cool the flow of air from the data center with the cooled external air produced by the adiabatic device to produce treated air;
   a damper system in fluid communication with the at least one heat exchanger and the flow of air from the data center such that a first damper of the damper system is in fluid communication with the flow of air from the data center and a second damper of the damper system is in fluid communication with the treated air from the heat exchanger; and a control system in communication with the damper system and configured to selectively direct the flow of air from the data center to the heat exchanger and to selectively direct a flow of the treated air from the at least one heat exchanger through the damper system.

2. The indirect free cooling module of claim 1, further comprising at least one sensor in communication with the control system, the at least one sensor being configured to determine at least one of a temperature and a humidity value of one of the source of external air and the air from the data center, wherein the control system is further configured to determine at least one operating condition based on at least one value determined by the at least one sensor.

3. The indirect free cooling module of claim 2, wherein the at least one sensor includes a first sensor and a second sensor, the first sensor in fluid communication with the flow of air from the data center and configured to determine a temperature value of the air from the data center, and the second sensor in fluid communication with the source of external air and configured to determine a dry bulb temperature value and a wet bulb temperature value of the source of external air.

4. The indirect free cooling module of claim 3, wherein the control system is further configured to receive a set point temperature value for the air from the data center, and the at least one operating condition includes at least one of:
 a difference between the value of the dry bulb temperature and the value of the wet bulb temperature is greater than a first threshold value;
 a difference between the value of the temperature of the air from the data center and the value of the dry bulb temperature is greater than a second threshold value;
 a difference between the value of the temperature of the air from the data center and the value of the wet bulb temperature is greater than the second threshold value; and
 the set point temperature has a greater value than either the value of the dry bulb temperature and the value of the wet bulb temperature.

5. The indirect free cooling module of claim 4, wherein the control system directs a flow of air from the data center to an inlet of the at least one heat exchanger and directs a flow of the treated air from an outlet of the at least one heat exchanger to an inlet of the second damper when at least one operating condition is satisfied.

6. The indirect free cooling module of claim 1, wherein the at least one heat exchanger includes a first heat exchanger having an inlet in fluid communication with the air from the data center and a second heat exchanger having an inlet in fluid communication with the cooled external air produced by the adiabatic device.

7. The indirect free cooling module of claim 6, wherein the first heat exchanger and the second heat exchanger are arranged in series.

8. A cooling system for cooling air from a data center, the cooling system comprising:
 a cooling device having an outlet in fluid communication with the data center;
 an indirect free cooling module comprising:
  an adiabatic device in fluid communication with a source of external air and configured to cool the source of external air to produce cooled external air;
  at least one heat exchanger configured to be in fluid communication with the adiabatic device and the flow of air from the data center and to cool the flow of air from the data center with the cooled external air produced by the adiabatic device to produce treated air;
 a damper system in fluid communication with the flow of air from the data center, the cooling device, and the at least one heat exchanger of the indirect free cooling module such that an inlet of a first damper of the damper system is in fluid communication with the flow of air from the data center and an outlet of the first damper is in fluid communication with an inlet to the cooling device, and an inlet of a second damper of the damper system is in fluid communication with the treated air from the heat exchanger and an outlet of the second damper is in fluid communication with the inlet to the cooling device; and
 a control system in communication with the damper system and configured to selectively direct the flow of air from the data center to an inlet of the at least one heat exchanger, or through the first damper to an inlet of the cooling device, or to both the inlet of the at least one heat exchanger and through the first damper to the inlet of the at least one cooling device.

9. The cooling system of claim 8, further comprising at least one sensor in communication with the control system, the at least one sensor being configured to determine at least one of a temperature value and a humidity value of one of the source of external air and the air from the data center, wherein the control system is further configured to determine at least one operating condition based on at least one value determined by the at least one sensor.

10. The cooling system of claim 9, wherein the at least one sensor includes a first sensor and a second sensor, the first sensor in fluid communication with the flow of air from the data center and configured to determine a temperature value of the air from the data center, and the second sensor in fluid communication with the source of external air and configured to determine a dry bulb temperature value and a wet bulb temperature value of the source of external air.

11. The cooling system of claim 10, wherein the control system is further configured to receive a set point temperature value for the air from the data center, and the at least one operating condition includes at least one of:
 the set point temperature having a higher value than either the value of the dry bulb temperature and the value of the wet bulb temperature;
 a difference between the value of the dry bulb temperature and the value of the wet bulb temperature is greater than a first threshold value;
 a difference between the value of the temperature of the air from the data center and the value of the dry bulb temperature is greater than a second threshold value;
 a difference between the value of the temperature of the air from the data center and the value of the wet bulb temperature is greater than the second threshold value; and
 the set point temperature has a greater value than either the value of the dry bulb temperature and the value of the wet bulb temperature.

12. The cooling system of claim 11, wherein the control system directs a flow of air from the data center to the inlet of the at least one heat exchanger and directs a flow of the treated air from the at least one heat exchanger through the second damper when at least one operating condition is satisfied.

13. The cooling system of claim 12, wherein the flow of treated air from the at least one heat exchanger and through the second damper is directed to the inlet of the cooling device.

14. The cooling system of claim 11, wherein the control system directs a flow of air from the data center through the first damper to the inlet of the cooling device when at least one operating condition is not satisfied.

15. The cooling system of claim 11, wherein the control system directs a flow of air from the data center to the heat exchanger and through the first damper to the inlet of the at least one cooling device when at least one operating condition is satisfied and when at least one operating condition is not satisfied.

16. The cooling system of claim 8, wherein the indirect free cooling module is configured to be retrofitted with the cooling device and the damper system.

17. A method of cooling air from a data center using a cooling system, the cooling system comprising a cooling device, an indirect free cooling module comprising an adiabatic device and at least one heat exchanger, a damper system, a first sensor configured to determine a temperature value of a flow of air from the data center, and a second sensor configured to determine a dry bulb temperature value and a wet bulb temperature value of a source of external air, the method comprising:
 receiving a set point temperature value for the flow of air from the data center;
 determining a temperature value of the flow of air from the data center using the first sensor;
 determining a dry bulb temperature value and a wet bulb temperature value of the source of external air using the second sensor;
 calculating a difference between the value of the dry bulb temperature and the value of the wet bulb temperature to determine a first calculated value;
 calculating a difference between the value of the temperature of the air from the data center and the value of the dry bulb temperature to determine a second calculated value;
 calculating a difference between the value of the temperature of the air from the data center and the value of the wet bulb temperature to determine a third calculated value;
 calculating a difference between the value of the set point temperature and the value of the wet bulb temperature to determine a fourth calculated value; and
 selectively directing the flow of air from the data center through the at least one heat exchanger and a first damper of the damper system to an inlet of the cooling device, or through a second damper of the damper system to the inlet of the cooling device, or through both the at least one heat exchanger and through the first damper to the inlet of the cooling device and through the second damper to the inlet of the cooling device based on at least one of the first calculated value, the second calculating value, the third calculated value, and the fourth calculated value.

18. The method of claim 17, further comprising directing the flow of air from the data center through the second damper to the inlet of the cooling device when the first calculated value is lower than a first threshold value and the second calculated value is lower than a second threshold value.

19. The method of claim 17, further comprising directing the flow of air from the data center through the at least one heat exchanger and the first damper to the inlet of the cooling device when the first calculated value is greater than a first threshold value, the third calculated value is greater than a second threshold value, and the fourth calculated value is greater than a third threshold value.

20. The method of claim 17, further comprising directing the flow of air from the data center through the at least one heat exchanger and the first damper to the inlet of the cooling device and through the second damper to the inlet of the cooling device when the first calculated value is greater than a first threshold value, the third calculated value is greater than a second threshold value, and the fourth calculated value is lower than a third threshold value.

* * * * *